United States Patent [19]
Yamamoto et al.

[11] Patent Number: 5,518,936
[45] Date of Patent: May 21, 1996

[54] METHOD FOR PRODUCING METAL WIRINGS ON AN INSULATING SUBSTRATE

[75] Inventors: Tomohiko Yamamoto, Tenri; Yasunori Shimada, Nara; Hiroshi Morimoto, Kitakatsuragi, all of Japan

[73] Assignee: Sharp Kabushiki Kaisha, Osaka, Japan

[21] Appl. No.: 403,125

[22] Filed: Mar. 13, 1995

Related U.S. Application Data

[63] Continuation of Ser. No. 59,309, May 11, 1993, abandoned.

[30] Foreign Application Priority Data

May 12, 1992 [JP] Japan ................................. 4-119285

[51] Int. Cl.$^6$ ................................................ H01L 21/265
[52] U.S. Cl. ........................ 437/24; 437/49; 437/192; 437/237; 437/244; 437/983
[58] Field of Search ............................. 437/24, 49, 187, 437/188, 192, 237, 244, 263, 983; 287/776

[56] References Cited

U.S. PATENT DOCUMENTS

| | | | |
|---|---|---|---|
| 4,016,007 | 4/1977 | Wada et al. | 437/24 |
| 4,646,426 | 3/1987 | Sasaki | 437/245 |
| 5,126,283 | 6/1992 | Pintchovski et al. | 437/188 |
| 5,148,259 | 9/1992 | Kato et al. | 357/67 |
| 5,236,866 | 8/1993 | Yasue | 437/187 |
| 5,250,459 | 10/1993 | Lee | 437/52 |
| 5,254,870 | 10/1993 | Kimura | 257/659 |

FOREIGN PATENT DOCUMENTS

| | | |
|---|---|---|
| 2-106723 | 4/1990 | Japan . |
| 02257642 | 10/1990 | Japan . |
| 2-251823 | 10/1990 | Japan . |
| 0351823 | 3/1991 | Japan . |
| 3-248568 | 11/1991 | Japan . |

OTHER PUBLICATIONS

Ion Implantation in Semiconductors, Susumu Namba (Editor), Plenum Press, New York, NY (1975) pp. 325–333.
Stanley Wolf, "Silicon Processing for the VLSI ERA" vol. 2, Lattice Press, Cal. (1990) pp. 121–131.
Madakson: "Effects of Tin Ion and Nitrogen Ion Implantation on the Oxidation of Titanium," pp. 205–212, *Materials Science & Engineering*, (1987).

*Primary Examiner*—George Fourson
*Assistant Examiner*—Thomas G. Bilodeau
*Attorney, Agent, or Firm*—Nixon & Vanderhye

[57] ABSTRACT

A method for producing metal wirings on an insulating substrate is disclosed. The method comprises the steps of forming a metal wiring layer of a predetermined shape on a predetermined position of the insulating substrate, the metal wiring layer being made of a metal capable of being oxidized; implanting the metal wiring layer with an impurity element; and forming an insulating layer by oxidizing the surface of the metal wiring layer after implanting the impurity element.

19 Claims, 5 Drawing Sheets

ION SHOWER OR PLASMA OF NITROGEN OR CARBON

FIG. 3
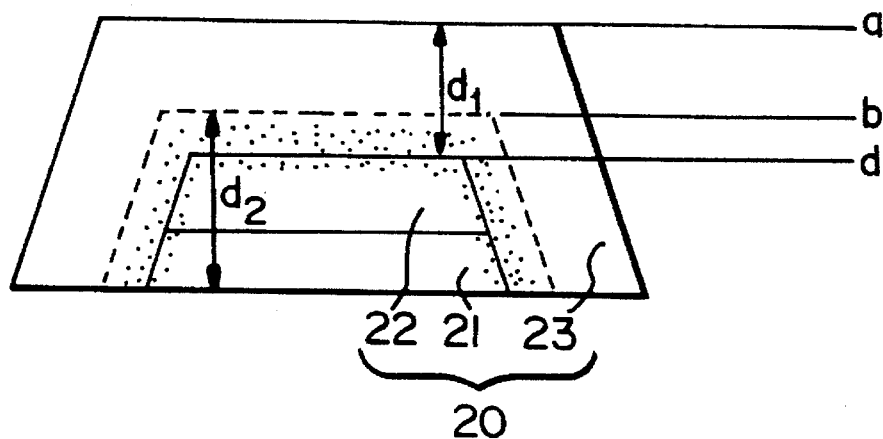
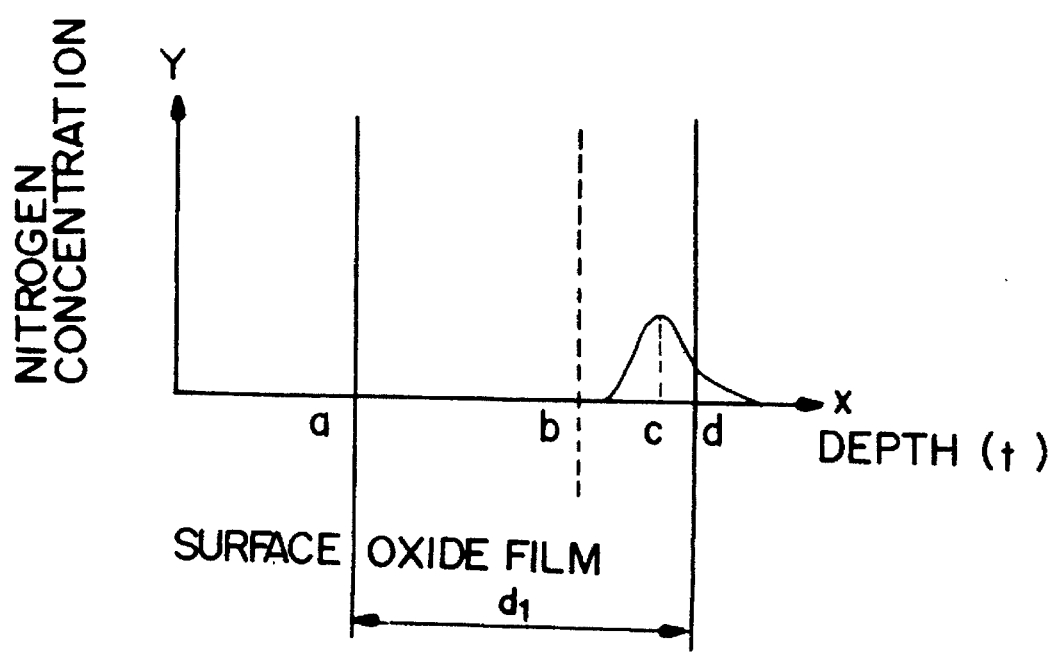
FIG. 4

METHOD FOR PRODUCING METAL WIRINGS ON AN INSULATING SUBSTRATE

This is a continuation of application Ser. No. 08/059,309, filed May 11, 1993, now abandoned.

BACKGROUND OF THE INVENTION

1. Field of the Invention

The present invention relates to a method for producing metal wirings which are formed on an insulating substrate for fabricating an active matrix substrate used for a liquid crystal display apparatus or the like.

2. Description of the Related Art

A liquid crystal display apparatus employing an active matrix driving system includes an active matrix substrate which has an array of thin film transistors (hereinafter abbreviated as TFTs) and gate electrode wirings running between the TFTs. Such gate electrode wirings are made of metal which can form a "self oxide film" on the surface by anodic oxidation, thermal oxidation, or the like. After the formation of such an oxide film which functions as an insulating layer, another insulating layer made of $SiN_x$, $SiO_2$, or the like is formed. Thus, the gate electrode wirings have a "double-insulation structure".

The gate electrode wirings have gate electrodes extending therefrom, each of which constitutes the TFT together with a source electrode and a drain electrode. The source electrodes extend from source electrode wirings which also run between TFTs in a direction vertical to the gate electrode wirings. When the gate electrode wirings and the gate electrodes extended therefrom have the above double-insulation structure, the insulation property of the gate electrodes from the source electrodes and the drain electrodes is improved, compared with that of the gate electrodes without the oxide film. Examples of metals capable of forming an oxide film include tantalum (Ta), niobium (Nb), titanium (Ti), and aluminum (Al). Especially, Ta is widely used for insulating layers for thin film diodes (hereinafter abbreviated as TFDs) not only for the TFTs since $Ta_2O_5$ obtained by anodically or thermally oxidizing Ta exhibits the Poole-Flenkel conduction.

Ta has a lattice structure of two different types: a body-centered cubic lattice structure and a tetragonal cubic lattice structure. The Ta with the body-centered cubic lattice structure is called α-Ta, and the Ta with the tetragonal cubic lattice structure is called β-Ta. The specific resistance of β-Ta in the form of a thin film is as large as approximately 170–200 μΩ.cm, while the specific resistance of α-Ta in the form of a bulk is as small as approximately 13–15 μΩ.cm.

In recent years, a demand for a liquid crystal display apparatus with a wider screen and higher precision has increased. To realize such a liquid crystal display apparatus, gate electrode wirings and source electrode wirings must be made longer and narrower with smaller resistance than conventional ones. To satisfy these requirements, gate electrode wirings are preferably made of a material with small specific resistance such as α-Ta. In most cases, however, a film obtained by depositing Ta by normal sputtering is a β-Ta film having a high specific resistance. An α-Ta film can be formed by doping a Ta film with a minute amount of nitrogen at the formation of the Ta film by sputtering. However, due to the presence of this dopant nitrogen, the specific resistance of such an α-Ta film increases to approximately 60 to 100 μΩ.cm, which is too large to be used for the gate electrode wirings. The dependence of the resistivity and temperature coefficient of resistivity of a Ta film on the dose of ions such as $Ar^+$ and $N_2^+$ is described in K. H. Goh, et al., "Ion impact chemistry in thin metal films; Argon, oxygen and nitrogen bombardment of tantalum", Ion Implantation in Semiconductors, Plenum Press, pp. 325–333.

It is also known that an α-Ta film can be formed by depositing Ta on a thin film base such as Nb, Mo, and $TaN_x$ with the body-centered cubic lattice structure, instead of the doping of nitrogen. The deposited Ta is known to become α-Ta by an influence of the film base. The resultant non-doped α-Ta film has a specific resistance as small as approximately 20 to 30 μΩ.cm, which can be suitably used for the gate electrode wirings.

However, the non-doped α-Ta has disadvantages as follows: when an oxide film is formed on a surface of the non-doped α-Ta film, the insulation property of the oxide film is low compared with the case of an α-Ta film doped with nitrogen.

Further, while a liquid crystal display apparatus requires the symmetry in the voltage-current characteristic with regard to the zero-axis of the voltage, the voltage-current characteristic of $Ta_2O_5$ obtained by oxidizing the non-doped α-Ta without nitrogen is not symmetrical with regard to the zero-axis of the voltage.

For the above reasons, an active matrix substrate including the metal wirings made of non-doped α-Ta is not suitable for the realization of a large-scale, high-precision liquid crystal display apparatus.

Japanese Laid-Open Patent Publication No. 3-51823 discloses a method of implanting an insulating layer with ions after the formation of the insulating layer so as to ensure a stable voltage-current characteristic for a switching element composed of three-layer structure of metal-insulator-metal for a liquid crystal display apparatus. However, the disclosure does not include a method for reducing the resistance of metal wirings as well as improving the insulation thereof so as to achieve a large-scale, high-precision liquid crystal display apparatus.

SUMMARY OF THE INVENTION

The method for producing metal wirings on an insulating substrate of this invention comprises the steps of: forming a metal wiring layer of a predetermined shape on a predetermined position of the insulating substrate, the metal wiring layer being made of a metal capable of being oxidized; implanting the metal wiring layer with an impurity element; and forming an insulating layer by oxidizing the surface of the metal wiring layer after implanting the impurity element.

Thus, the invention described herein makes possible the advantages of (1) providing a method for producing metal wirings so that the specific resistance of the metal wirings is large only in the surface portion and small in other portions; (2) providing a method for producing metal wirings capable of forming an insulating layer with an excellent insulation property preventing the current from flowing non-linearly with regard to the voltage; (3) providing a method for producing metal wirings capable of forming an insulating layer with a voltage-current characteristic symmetrical with regard to the zero-axis of the voltage; and (4) providing a method for producing electrode wirings applicable to the fabrication of an active matrix substrate used for a liquid crystal display apparatus with a wide screen and high precision.

These and other advantages of the present invention will become apparent to those skilled in the art upon reading and understanding the following detailed description with reference to the accompanying figures.

BRIEF DESCRIPTION OF THE DRAWINGS

FIG. 3 is an enlarged sectional view of a gate electrode wiring for the active matrix substrate of FIG. 1.

FIG. 4 is a graph showing the concentration distribution of nitrogen in the gate electrode wiring of FIG. 3 as a function of the depth of the gate electrode wiring.

DESCRIPTION OF THE PREFERRED EMBODIMENTS

Example 1

Figure 1:
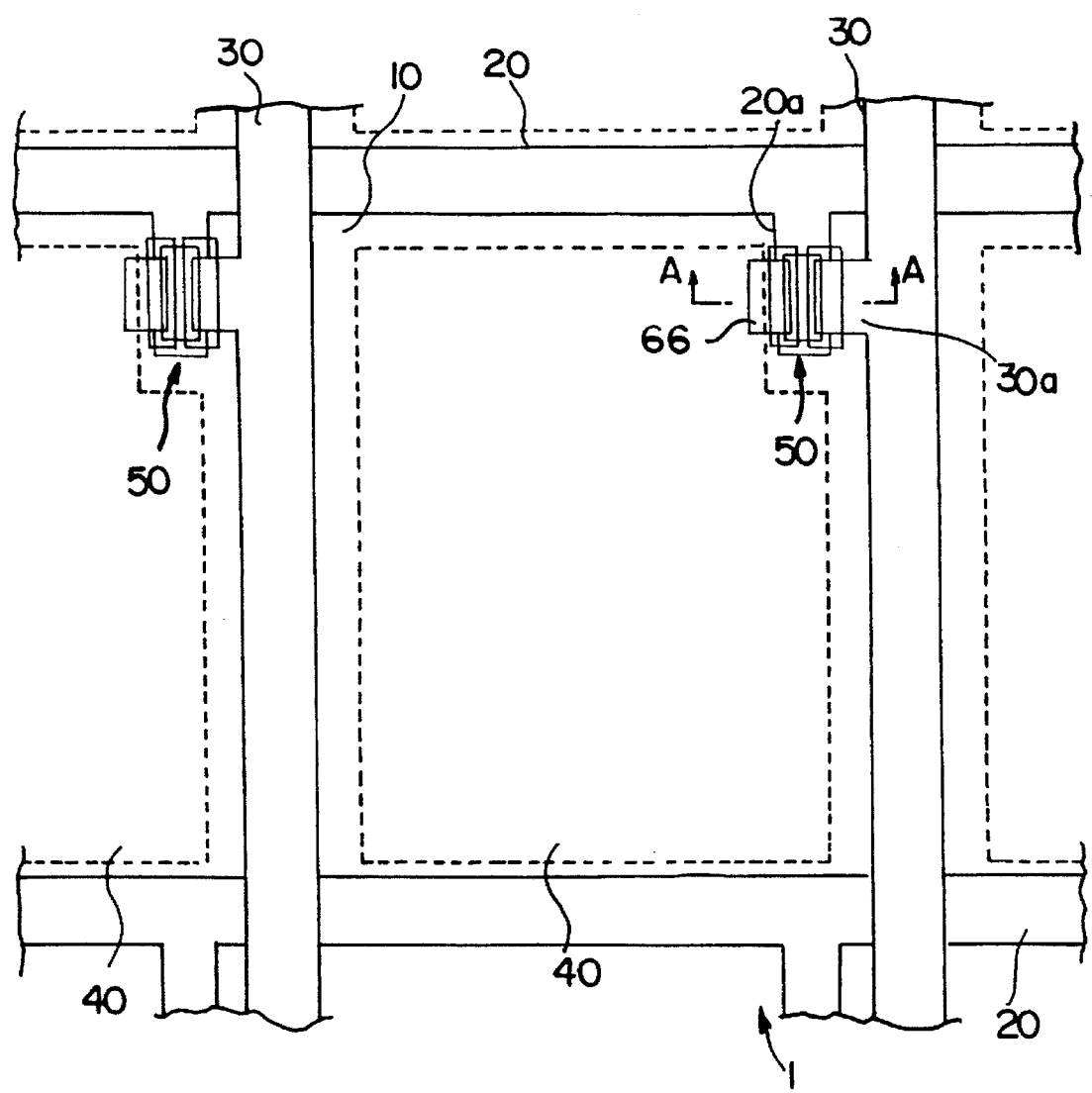
FIG. 1 is a partial plan view of an active matrix substrate fabricated using a method for producing metal wirings according to the present invention.

FIG. 1 shows an active matrix substrate for a liquid crystal display apparatus employing an active matrix driving system. The active matrix substrate herein refers to a substrate with TFTs and gate and source electrode wirings arranged in a matrix on an insulating substrate. The method for producing metal wirings of the present invention can be applied to the formation of gate electrodes for the active matrix substrate used for a liquid crystal display apparatus.

Referring to FIG. 1, the active matrix substrate includes an insulating glass substrate 10, a plurality of parallel gate electrode wirings 20 formed on the glass substrate 10 according to the method of the present invention, and a plurality of parallel source electrode wirings 30 formed on the glass substrate 10 so as to cross the gate electrode wirings 20. The active matrix substrate further includes a pixel electrode 40 formed within each rectangular area defined by the adjacent gate electrode wirings 20 and the adjacent source electrode wirings 30, and a TFT 50 formed at a corner of each rectangular area. The TFT 50 is electrically connected to the pixel electrode 40. The TFT 50 includes a gate electrode 20a as an extension from the nearest gate electrode wiring 20, a source electrode 30a as an extension from the nearest source electrode wiring 30, and a drain electrode 66. Thus, the TFT 50 is electrically connected to the nearest gate electrode wiring 20 and the nearest source electrode wiring 30.

The fabrication of the above active matrix substrate will be described with reference to FIGS. 2A to 2I.

Figure 2A:
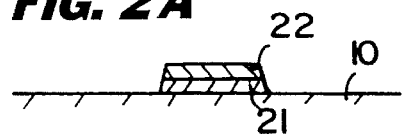
FIGS. 2A to 2I are segmented sectional views taken along line A—A of FIG. 1 showing stages in the process of fabricating the active matrix substrate of FIG. 1.

Referring to FIG. 2A, in order to form the gate electrode wiring 20, Nb having a body-centered cubic lattice structure is first deposited on the surface of the glass substrate 10 to a thickness in the range of several nanometers to 100 nm, preferably in the range of 5 to 15 nm. Mo, $TaN_x$, or the like having a body-centered cubic lattice structure can be used in place of Nb. Then, Ta which is not doped with nitrogen is deposited on the Nb layer by sputtering to a thickness of 100–500 nm, preferably 250–350 nm.

A resist with a pattern of gate electrode wirings (not shown) is disposed on the Ta layer, and portions of the Nb layer and the Ta layer not covered with the resist are etched off so as to obtain an Nb wiring layer 21 and a Ta wiring layer 22 patterned into the shape of the gate electrode wirings 20 with the gate electrodes 20a extending therefrom as shown in FIG. 1.

Figure 2B:
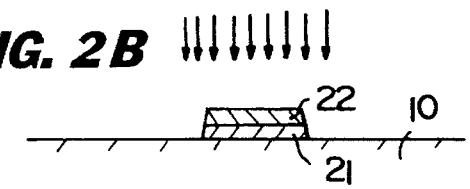

Referring to FIG. 2B, the Ta wiring layer 22 is implanted with nitrogen as the impurity by ion showering at an energy of 20–300 KeV, preferably 50–200 KeV, more preferably 80–150 KeV. The dose of implantation is $1.0 \times 10^{11}$ to $1.0 \times 10^{20}$ ions/cm$^2$, preferably $1.0 \times 10^{13}$ to $1.0 \times 10^{18}$ ions/cm$^2$, more preferably $1.0 \times 10^{14}$ to $1.0 \times 10^{17}$ ions/cm$^2$. An element other than nitrogen such as carbon which can enter the α-Ta crystal lattice can also be used as the impurity.

The implantation of the impurity can also be performed by plasma annealing. In the plasma annealing, the Ta wiring layer 22 is annealed in plasma containing atoms of the element such as nitrogen and carbon which can enter the crystal lattice under the conditions of a pressure of 5–500 Pa, preferably 10–100 Pa, and a power density of 30–400 mW/cm$^2$, preferably 60–240 mW/cm$^2$ for 30–420 minutes, preferably 60–300 minutes.

Figure 2C:
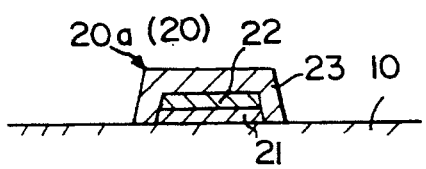

Then, referring to FIG. 2C, a first insulating layer 23 covering the Nb wiring layer 21 and the Ta wiring layer 22 is formed by anodically oxidizing the exposed surfaces of the Ta wiring layer 22 and the Nb wiring layer 21. Thus, the gate electrode wirings 20 with the gate electrodes 20a extending therefrom are formed on the glass substrate 10.

The cross section of the gate electrode wiring 20 formed by the above-described steps is shown in FIG. 3. In FIG. 3, black dots show the distribution of implanted ions. The distance $d_1$ is a thickness of the insulating layer 23 formed by anodic oxidation, and $d_2$ is a thickness of the Nb wiring layer 21 and the Ta wiring layer 22 before the anodic oxidation. The thicknesses $d_1$ and $d_2$ are both approximately 100–500 nm.

FIG. 4 shows the concentration of implanted ions in the gate electrode wiring 20 after the anodic oxidation as a function of the depth of the gate electrode wiring 20. The y axis shows the concentration of implanted nitrogen ions, and the x axis shows the depth of the gate electrode wiring 20. Point a corresponds to the top surface of the first insulating layer 23, point b corresponds to the top surface of the Ta wiring layer 22 before the anodic oxidation, and point d corresponds to the top surface of the Ta wiring layer 22 after the anodic oxidation. Distance $d_1$ between point a and point d is the thickness of the first insulating layer 23.

The distribution of the implanted ions resembles a Gaussian distribution having a maximum value at point c. As is observed from the FIG. 4, the implanted ions are diffused in the surface portion of the Ta wiring layer 22 before the anodic oxidation. Therefore, the first insulating layer 23 formed by the oxidation of the surface portion of the Ta wiring layer 22 contains most of the implanted ions. Point c which gives the maximum concentration in the Gaussian distribution of the implanted ions may be equal to point b corresponding to the surface of the Ta wiring layer 22 before the anodic oxidation, but is generally located somewhere between point b and point d in the Ta wiring layer 22 after the anodic oxidation. Nitrogen ions are implanted so that the concentration thereof at point d is 0.05% or greater of the metal Ta. When carbon is used as the impurity, the concentration of implanted carbon ions should be 2% or greater of the metal Ta at point d.

Thus, in the gate electrode wiring 20 formed by the above method, only the surface portion of the Ta wiring layer 22 close to the first insulating layer 23 contains implanted nitrogen ions. Accordingly, the specific resistance increases only in this surface portion, but not in the entire portion of the Ta wiring layer 22. As a result, the gate electrode wiring 20 formed according to the method of the present invention can have both the first insulating layer 23 having an excellent insulation property and the Ta wiring layer 22 having a sufficiently low resistance.

Figure 2D:
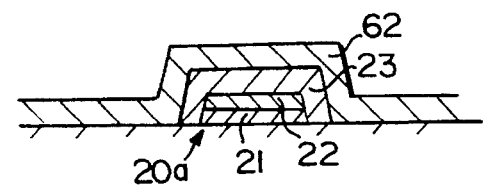

Then, referring to FIG. 2D, after the formation of the first insulating layer 23 by anodic oxidation, $SiN_x$ is deposited on the entire top surface of the layered structure by sputtering or CVD to a thickness of, for example, approximately 300 nm, so as to form a second insulating layer 62.

Figure 2E:
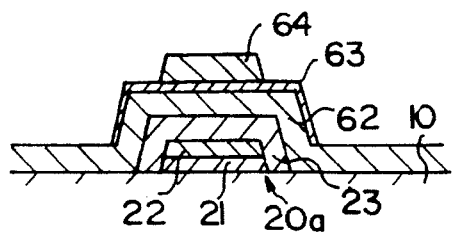

Referring to FIG. 2E, amorphous silicon (a-Si) and $SiN_x$ are deposited in this order by plasma CVD on the entire surface of the second insulating layer 62 to thicknesses of approximately 30 nm and 200 nm, respectively. Then, these deposited layers are etched by photoetching so as to form a semiconductor layer 63 covering only a portion of the second insulating layer 62 overlying the gate electrode 20a to form the TFT 50, and a third insulating layer 64 on the semiconductor layer 63, respectively.

Figure 2F:
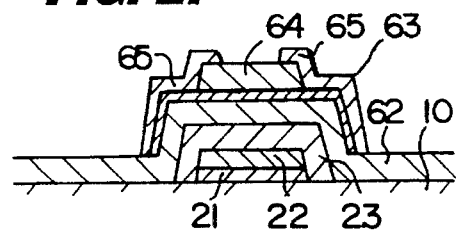

Then, referring to FIG. 2F, a-Si doped with phosphorus (P) is deposited on the entire surface of the layered structure by plasma CVD to a thickness of approximately 100 nm. Then, a portion of the a-Si deposited on the center portion of the third insulating layer 64 is removed by photoetching so as to form an a-Si layer 65 covering the semiconductor layer 63 and the side portions and top peripheral portions of the third insulating layer 64.

Figure 2G:
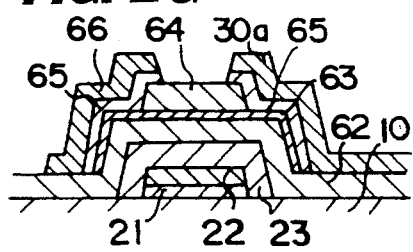

Further, referring to FIG. 2G, Mo is deposited on the entire surface of the layered structure by sputtering to a thickness of 300 nm. Thereafter, a portion of the Mo deposited on the center portion of the third insulating layer 64 is removed by photoetching so as to form the drain electrode 66 made of Mo and the source electrode 30a made of Mo.

Figure 2H:
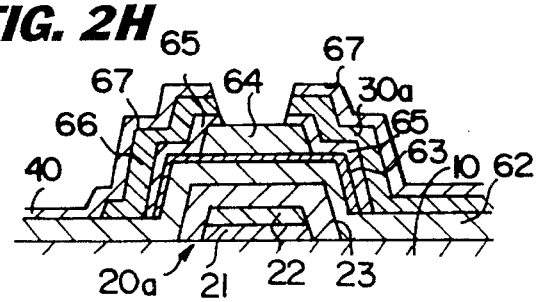

Referring to FIG. 2H, indium tin oxide (ITO) is then deposited on the entire surface of the layered structure by sputtering. Then, a portion of the ITO deposited on the center portion of the third insulating layer 64 is removed by photoetching so as to form an ITO layer 67 as well as the pixel electrode 40 as shown in FIG. 1.

Figure 2I:
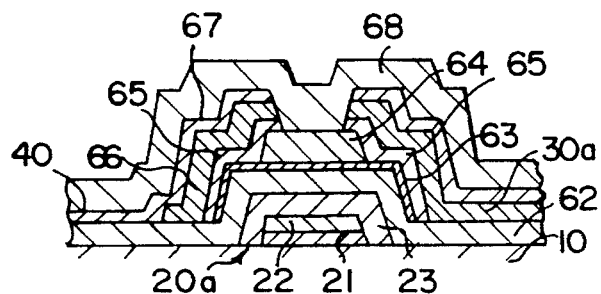

Finally, referring to FIG. 2I, $SiN_x$ is deposited on the entire surface of the layered structure by plasma CVD so as to form a protective film 68. The active matrix substrate is thus completed.

In the active matrix substrate obtained in the above-described method, the gate electrode wirings 20 having the insulating layer 23 formed by anodic oxidation have a small specific resistance, so that the active matrix substrate can be widened, and the gate electrode wirings 20 can be small and narrow without causing trouble such as excessive parasitic capacitance, crosstalk, and/or manufacturing difficulties. Furthermore, the first insulating layer 23 implanted with nitrogen has excellent insulative properties, so that failure in insulation between the gate electrode wirings 20 and the source electrode wirings 30 will not occur.

Example 2

Figure 5:
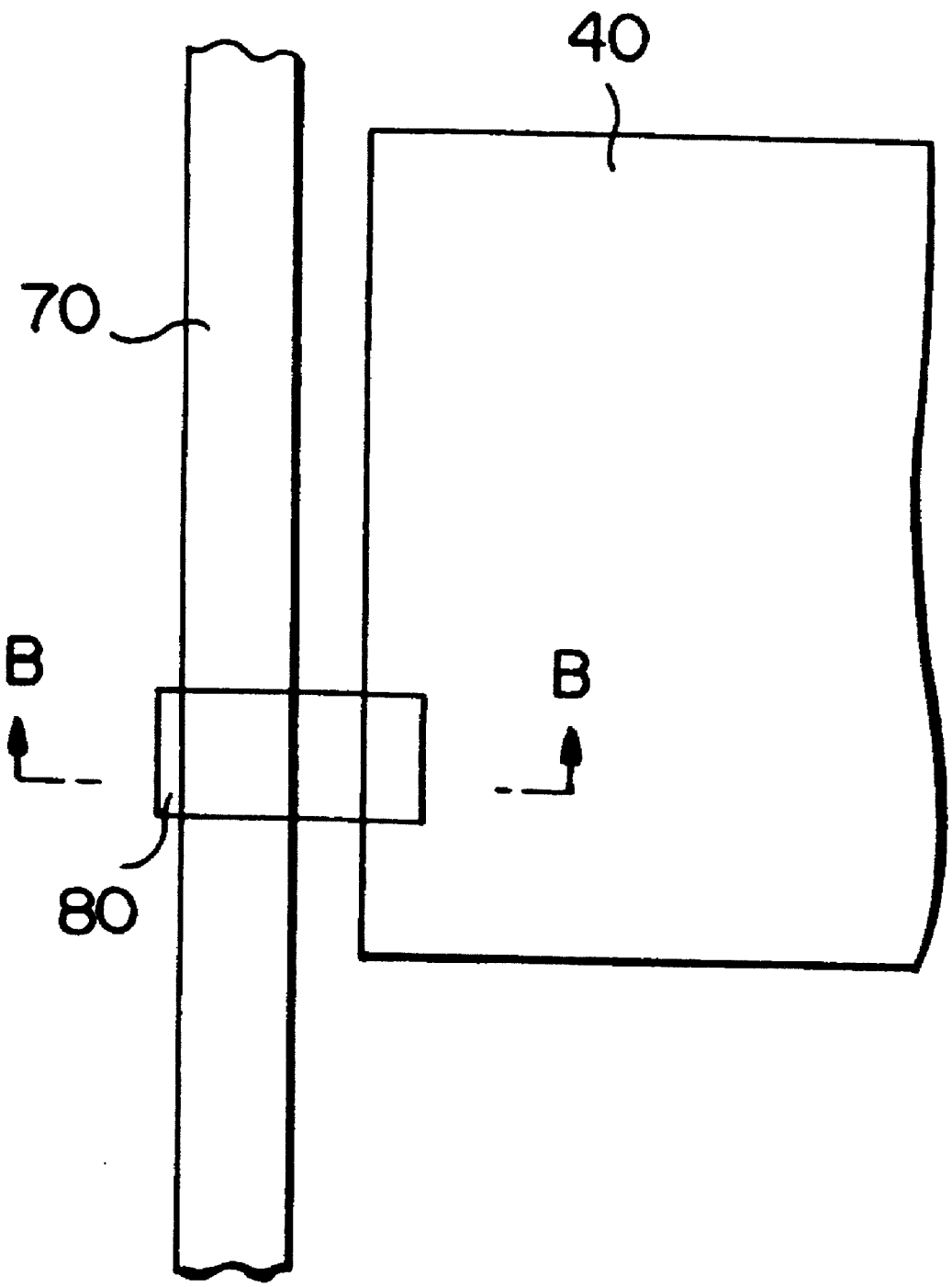
FIG. 5 is a partial plan view of another active matrix substrate fabricated using the method for producing metal wirings according to the present invention.

FIG. 5 shows another example of an active matrix substrate having gate electrode wirings formed according to the method of the present invention.

The active matrix substrate of this example includes a plurality of pixel electrodes 40 arranged in a matrix on a glass substrate 10 and a plurality of scanning signal wirings 70 formed according to the method of the present invention running along rows of the pixel electrodes 40. Each of the pixel electrodes 40 is electrically connected to the adjacent scanning signal wiring 70 through a thin film diode (TFD). FIG. 5 shows only one pixel electrode 40 and the scanning signal wiring 70 connected to the pixel electrode 40 through the TFD for simplification.

The fabrication of the above active matrix substrate will be described with reference to FIGS. 6A to 6E.

Figure 6A:
FIGS. 6A to 6E are segmented sectional views taken along line B—B of FIG. 5 showing stages in the process of fabricating the active matrix substrate of FIG. 5.

Referring to FIG. 6A, in order to form the scanning signal wiring 70, Nb having a body-centered cubic lattice structure is first deposited on the surface of the glass substrate 10 to a thickness in the range of several nanometers to 100 nm, preferably in the range of 5 to 15 nm. Then, Ta which is not doped with nitrogen is deposited on the Nb layer by sputtering to a thickness in a range of approximately 100–500 nm, preferably 250–350 nm.

A resist with a pattern of scanning signal wirings (not shown) is disposed on the Ta layer, and portions of the Nb layer and the Ta layer not covered with the resist are etched off so as to obtain an Nb wiring layer 71 and a Ta wiring layer 72 patterned into the shape of the scanning signal wirings 70.

Figure 6B:
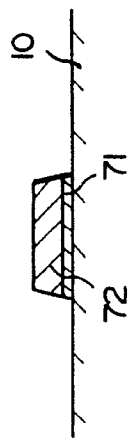

Referring to FIG. 6B, the Ta wiring layer 72 is implanted with nitrogen impurities by ion showering under the same conditions as those described in Example 1 referring to FIG. 2B. The implantation of impurities can also be performed by plasma annealing. The conditions for the plasma annealing are the same as those described in Example 1 referring to FIG. 2B.

Figure 6C:
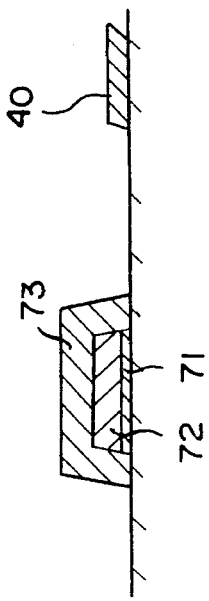

Thereafter, referring to FIG. 6C, a first insulating layer 73 covering the Nb wiring layer 71 and the Ta wiring layer 72 is formed by anodically oxidizing the exposed surfaces of the Ta wiring layer 72 and the Nb wiring layer 71. Thus, the scanning signal wirings 70 are formed on the glass substrate 10. In this example, the thickness of the Nb wiring layer 71 and the Ta wiring layer 72 before anodic oxidation which corresponds to $d_2$ of FIG. 3 in Example 1 is in a range of approximately 100–500 nm, and the thickness of the first insulating layer 73 after the anodic oxidation which corresponds to $d_1$ of FIG. 3 is in a range of approximately 20–200 nm. As in Example 1, only the surface portion of the Ta wiring layer 72 close to the first insulating layer 73 is implanted with nitrogen ions. Accordingly, the specific resistance increases only in this surface portion, but not in the entire portion of the Ta wiring layer 72. Moreover, the first insulating layer 73 has a voltage-current characteristic which is symmetrical to the zero-axis of the voltage.

Figure 6D:
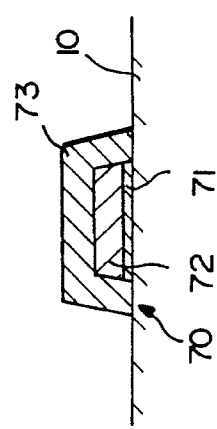

Then, referring to FIG. 6D, ITO is deposited on the entire surface of the layered structure by sputtering, and patterned into a predetermined shape by photoetching so as to form the pixel electrode 40.

Figure 6E:
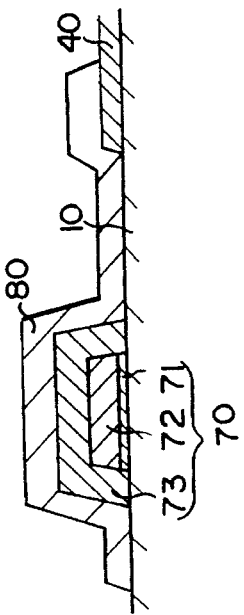

Referring to FIG. 6E, Cr is deposited on the entire structure of the layered structure by sputtering, and etched by photoetching so as to form an upper electrode 80 which crosses over the scanning signal wiring 70 and partially overlaps the pixel electrode 40. The active matrix substrate is thus completed. The metal of the metal wiring layer may be Ta, Nb, Ti or Al.

As described above, according to the method of the present invention, impurities are implanted in a metal layer and thereafter the surface portion of the metal layer is oxidized. Therefore, in the resultant metal wiring, only the surface portion of the metal layer to be oxidized has a large specific resistance, and the other portion of the metal layer has a small specific resistance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing metal wirings on an insulating substrate, comprising the steps of:

forming a metal wiring layer on the insulating substrate, the metal wiring layer being made of a metal capable of being oxidized;

implanting the surface of the metal wiring layer with an impurity element; and forming an insulating layer by oxidizing the surface of the metal wiring layer after implanting the impurity element, wherein the metal wirings include gate electrode wirings or scanning signal wirings for an active matrix substrate using thin film transistors.

2. The method according to claim 1, wherein the metal of the metal wiring layer is selected from the group consisting of Ta, Nb, Ti, and Al.

3. The method according to claim 1, wherein the impurity element is selected from the group consisting of nitrogen and carbon.

4. The method according to claim 1, wherein the step of implanting the metal wiring layer with the impurity element is performed by ion implantation.

5. The method according to claim 1, wherein the step of implanting the metal wiring layer with the impurity element is performed by plasma annealing.

6. The method according to claim 1, wherein the metal wirings include gate electrode wirings for an active matrix substrate using thin film transistors, the gate electrode wirings include a body-centered cubic lattice of metal deposited on the insulating substrate and the insulating layer is formed by oxidizing the surface of the body-centered cubic lattice of metal, wherein the insulating layer contains most of the implanted impurity element.

7. A method according to claim 1, wherein the metal wirings include scanning signal wirings for an active matrix substrate using thin film diodes.

8. A method for producing metal wirings on an insulating substrate, comprising the steps of:

forming a Ta, Nb or Al metal wiring layer on an insulating substrate;

implanting the metal wiring layer with an impurity element; and forming an insulating layer by oxidizing the surface of the metal wiring layer after implanting the impurity element.

9. The method according to claim 8, wherein the impurity element is nitrogen or carbon.

10. The method according to claim 8, wherein the impurity element is implanted by ion implantation.

11. The method according to claim 8, wherein the impurity element is implanted by plasma annealing.

12. The method according to claim 8, wherein the metal wirings include gate electrode wirings for an active matrix substrate using thin film transistors, the gate electrode wirings include a body-centered cubic lattice of metal deposited on the insulating substrate and the insulating layer is formed by oxidizing the surface of the body-centered cubic lattice of metal, wherein the insulating layer contains most of the implanted impurity element.

13. The method according to claim 8, wherein the metal wirings include scanning signal wirings for an active matrix substrate using thin film diodes.

14. A method for producing metal wirings on an insulating substrate, comprising the steps of:

forming an Nb metal wiring layer on an insulating substrate;

implanting the metal wiring layer with an impurity element; and forming an insulating layer by oxidizing the surface of the metal wiring layer after implanting the impurity element.

15. The method according to claim 14, wherein the impurity element is nitrogen or carbon.

16. The method according to claim 14, wherein the impurity element is implanted by ion implantation.

17. The method according to claim 14, wherein the impurity element is implanted by plasma annealing.

18. The method according to claim 14, wherein the metal wirings include gate electrode wirings for an active matrix substrate using thin film transistors.

19. The method according to claim 14, wherein the metal wirings include scanning signal wirings for an active matrix substrate using thin film diodes.

* * * * *